(12) United States Patent
Kulkarni et al.

(10) Patent No.: US 7,636,909 B1
(45) Date of Patent: Dec. 22, 2009

(54) AUTOMATICALLY GENERATING MULTITHREADED DATAPATHS

(75) Inventors: Chidamber R. Kulkarni, Santa Clara, CA (US); Gordon J. Brebner, Los Gatos, CA (US)

(73) Assignee: XILINX, Inc., San Jose, CA (US)

( * ) Notice: Subject to any disclaimer, the term of this patent is extended or adjusted under 35 U.S.C. 154(b) by 224 days.

(21) Appl. No.: 11/825,372

(22) Filed: Jul. 5, 2007

(51) Int. Cl.
*G06F 17/50* (2006.01)
(52) U.S. Cl. ...................................................... 716/18
(58) Field of Classification Search ................ None
See application file for complete search history.

(56) References Cited

U.S. PATENT DOCUMENTS

2007/0237146 A1* 10/2007 Hadzic et al. ............... 370/392

OTHER PUBLICATIONS

A. Raghunathan et al., "Controller re-specification to minimize switching activity in controller/data path circuits," ISLPED 1996 Monterey CA USA, pp. 301-304.*

* cited by examiner

*Primary Examiner*—Leigh Marie Garbowski
(74) *Attorney, Agent, or Firm*—Kevin T. Cuenot

(57) ABSTRACT

A method of automatically generating multithreaded datapaths from a circuit description can include identifying a plurality of process threads from a circuit description, wherein each process thread comprises at least one function, and representing each of the plurality of process threads as an order of operations graph including nodes that correspond to functions and edges that indicate dependencies between the functions. The method also can include identifying at least one conditional edge from the order of operations graphs. An updated circuit description can be generated that specifies a multiplexer for each conditional edge.

20 Claims, 2 Drawing Sheets

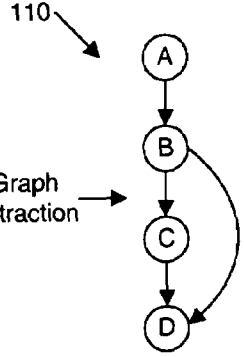
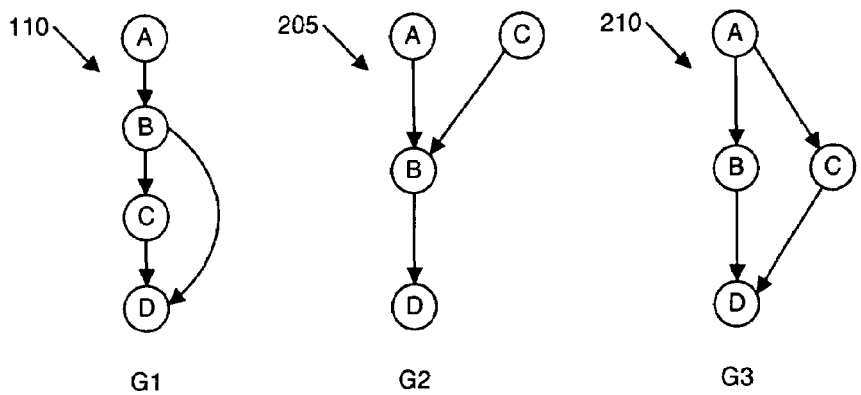
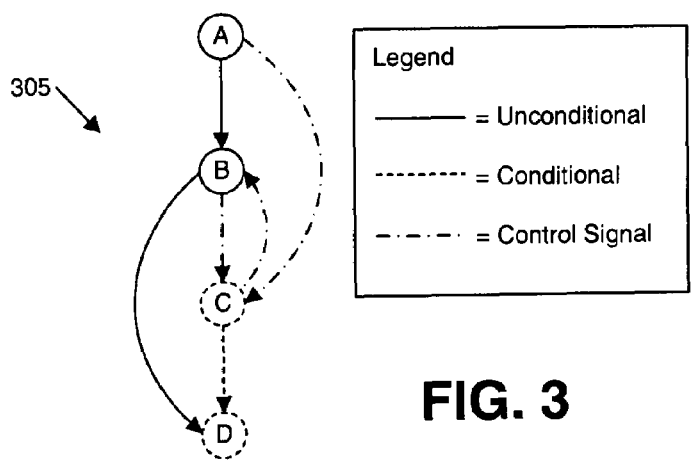
FIG. 1
FIG. 2
FIG. 3

AUTOMATICALLY GENERATING MULTITHREADED DATAPATHS

BACKGROUND

A network processor, in general, refers to an integrated circuit that is optimized for network routing functions and packet processing. Often, a network processor is implemented as a customized microprocessor. Typically, a network processor utilizes a plurality of distributed micro-engines, or sub-processors, which are multithreaded. A plurality of busses can be included that link distributed on-chip memories. Network processors can achieve a high level of data throughput as one micro-engine may handle network control packets while one or more other micro-engines pass data packets through the processor at network speeds.

One disadvantage of a dedicated network processor relates to datapaths. A datapath refers to the route that data follows within a circuit, system, processor, or the like. With respect to a dedicated network processor, datapaths among the various micro-engines in the device are fixed. Programmable logic devices (PLDs), such as field programmable gate arrays (FPGAs), can overcome the limitations of conventional network processors since customized datapaths can be created. In some cases, however, even customized datapaths may be idle for a significant amount of time, leading to an inefficient use of PLD resources. Such is the case, for example, where the network processing application manipulates only the header. Datapaths dedicated to processing the payload of the packet are likely idle during header manipulation functions.

BRIEF SUMMARY OF THE INVENTION

The present invention relates to creating multithreaded datapaths from a programmatic description of a circuit design. One embodiment of the present invention can include a method of automatically generating multithreaded datapaths from a circuit description. The method can include identifying a plurality of process threads from a circuit description, wherein each process thread comprises at least one function, and representing each of the plurality of process threads as an order of operations graph including nodes that correspond to functions and edges that indicate dependencies between the functions. The method also can include identifying at least one conditional edge from the order of operations graphs and generating an updated circuit description specifying a multiplexer for each conditional edge.

The method can include creating a storage register that stores output from at least one function of a process thread. Identifying at least one conditional edge can include merging the order of operations graphs for the process threads. An iterative intersection of the order of operations graphs can be taken where the number of iterations is less than the number of order of operation graphs.

During a first iteration of the iterative intersection, an intersection of all order of operations graphs corresponding to the process threads can be taken. Each edge identified during the first iteration can be determined to be an unconditional edge. During at least one subsequent iteration of the iterative intersection, groupings of order of operations graphs can be compared. The number of order of operations graphs in each grouping can be the same and less than the total number of order of operations graphs. Each edge that is identified during the at least one subsequent iteration can be stored as a conditional edge.

The method also can include determining control bits for each multiplexer associated with a conditional edge according to the order of operations graphs for the plurality of process threads. For a selected one of the multiplexers associated with a conditional edge, the number of inputs to that multiplexer can be determined according to the number of process threads including the edge associated with that multiplexer. The bitwidth of signals into each multiplexer associated with a conditional edge can be determined according to the circuit description.

Another embodiment of the present invention can include a method of automatically generating multithreaded datapaths from a circuit description including representing each of a plurality of process threads from the circuit description as an order of operations graph comprising nodes that correspond to functions of the process threads and edges that indicate dependencies among the functions. An iterative intersection of the order of operations graphs can be taken to identify at least one edge not shared by all order of operations graphs. A multiplexer can be associated with each identified edge. An updated circuit description specifying a multiplexer corresponding to each identified edge can be generated. Each multiplexer can selectively link functions common to more than one of the plurality of process threads.

Taking an iterative intersection can include, during a first iteration, taking an intersection of all order of operations graphs corresponding to the process threads. A determination can be made that each edge identified during the first iteration represents a non-multiplexed datapath. During at least one subsequent iteration, groupings of order of operations graphs can be compared. The number of order of operations graphs in each grouping can be the same for a given iteration and can be less than the total number of order of operations graphs. Each edge that is identified during the at least one subsequent iteration can be selected as an edge that represents a multiplexed datapath.

Yet another embodiment of the present invention can include a computer program product including a computer-usable medium having computer-usable program code that, when executed by an information processing system, causes the information processing system to perform the various steps and/or functions disclosed herein.

BRIEF DESCRIPTION OF THE SEVERAL VIEWS OF THE DRAWINGS

FIG. 1 is a diagram illustrating graph extraction in accordance with one embodiment of the present invention.

FIG. 2 is a diagram illustrating a plurality of order of operations graphs in accordance with another embodiment of the present invention.

FIG. 3 is a diagram illustrating a merged order of operations graph in accordance with another embodiment of the present invention.

DETAILED DESCRIPTION

Figure 4:
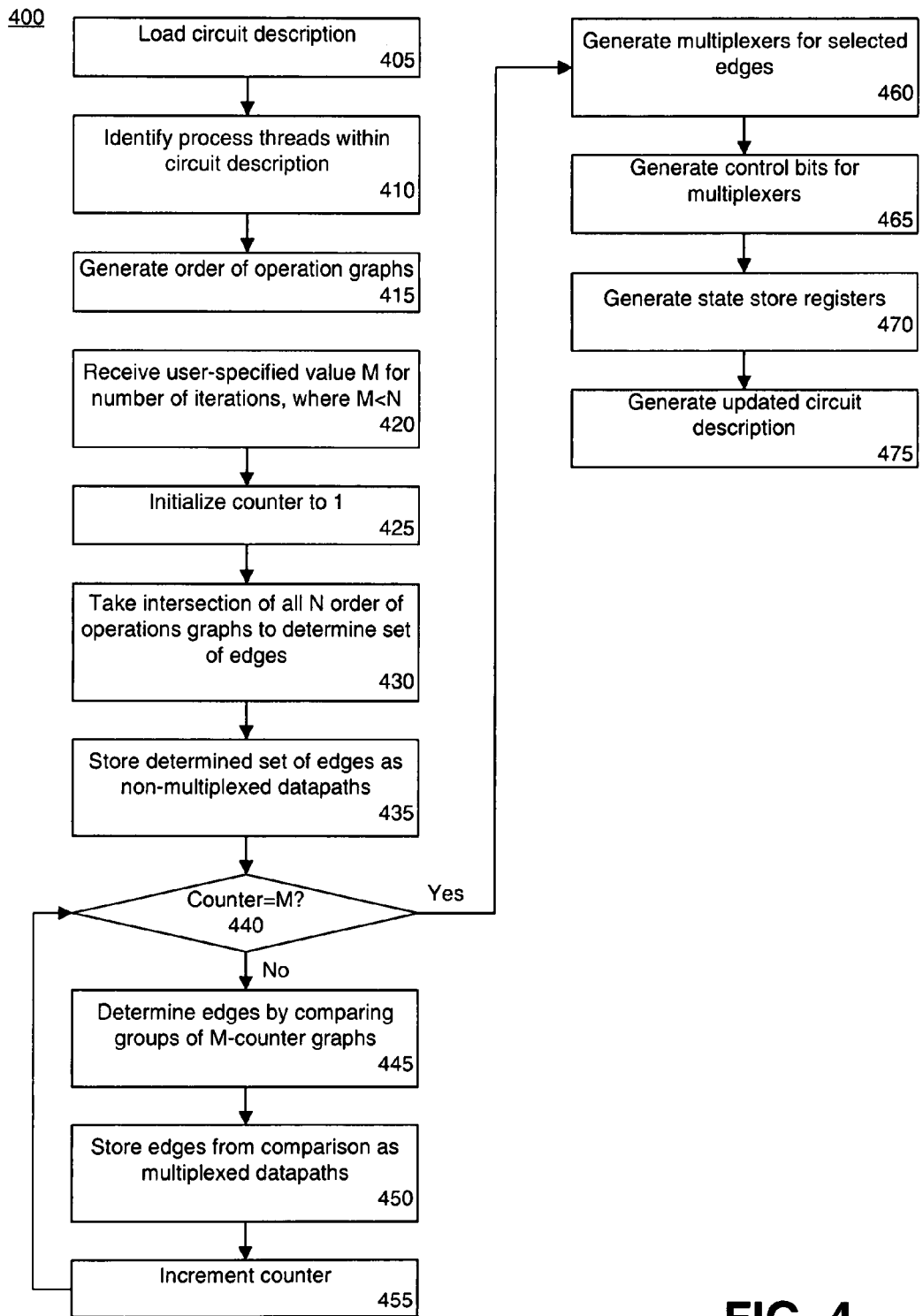
FIG. 4 is a flow chart illustrating a method of creating multithreaded datapaths for a circuit description in accordance with another embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The present invention relates to creating multithreaded datapaths for a circuit design from a circuit description. The embodiments disclosed herein provide a technique for generating the datapath of multi-threaded state machines. The surrounding controls related to storing intermediate states can be similar to conventional processors with state registers or sets of state registers.

The multithreaded datapaths allow one or more resources, which are common to more than one process thread of the circuit description, to be shared among the process threads. Rather than duplicating a given resource across a plurality of different process threads, that resource can be implemented one time and shared among the process threads. Multiplexers can be inserted into the circuit design to ensure that the appropriate signals are provided to the shared resource at the appropriate time. Accordingly, when the shared resource is idle for a given process thread, that resource can be used to process data for a different process thread to more fully utilize the processing power of the resource. As a result, the resource is idle for less time.

The embodiments disclosed herein can operate upon a cycle-accurate description of a circuit design. In general, a cycle-accurate description of a circuit design, for example, one specified in VHDL, Verilog, another hardware description language (HDL), a high-level language program, or the like, can be viewed as a state machine representation of the circuit design. Within the circuit description, the designer can specify or designate individual process threads. These process threads can be viewed as smaller state machines within the larger circuit description. In many cases, these state machines can execute quasi-concurrently. That is, when executing, the process threads may overlap somewhat, but not entirely.

In illustration, consider the case of a circuit description including a first state machine that executes in 20 cycles and a second state machine that executes in 15 cycles. If the second state machine begins execution 10 cycles after the first, the logic of the second state machine is not utilized for those 10 cycles. Accordingly, if one or more portions of the logic of the second state machine is common to the first state machine, those portions of logic can be made available to the first state machine during those first 10 cycles, i.e., until the second state machine begins execution. Logic can be combined between the two state machines for the non-overlapping periods of time.

Similarly, since the second state machine begins execution 10 cycles after the first state machine, the second state machine will continue execution for 5 cycles after the first state machine stops execution. Accordingly, if there are any portions of logic of the first state machine that are common to the second state machine, those portions of logic can be made available to the second state machine for use during those last 5 cycles that the first state machine would otherwise be idle. The datapaths, in reference to particular logic functions of a state machine or process thread, can be said to be multithreaded when shared in this manner since the state of one process thread can be preserved while the shared logic is used to process data from another process thread.

FIG. 1 is a diagram illustrating graph extraction in accordance with one embodiment of the present invention. FIG. 1 depicts a process thread 105 that has been excerpted from a cycle accurate circuit description. The process thread 105 has been identified by the circuit designer as a process thread within the circuit description itself. A circuit description can include a plurality of such process threads, with each being enumerated or indicated by the circuit designer. In one embodiment, only those process threads that are sequential in nature, or that are unrelated, are identified by the circuit designer in this manner for processing.

The process thread 105 can be analyzed and used to generate an order of operations graph 110. A "graph," as used herein, can refer to one or more nodes, where nodes are linked by edges or branches. In one embodiment, a graph can be specified and stored within computer memory. For example, a graph can exist as a data structure or other collection of data such that node and edge relationships are encoded within the data in memory. While a graph can be visually rendered, for example, to a display, a graph need not be visually presented. That is, a graph can be generated, processed, and/or otherwise manipulated as described herein without visually presenting the graph or the data associated with the graph.

The nodes A, B, C, and D of the order of operations graph 110 represent functions, or operations, that can be implemented in the logic of a target programmable logic device (PLD). The edges, or branches, indicate dependencies between the operations. For example, the edge denoted as AB, indicates that operation A is to be performed prior to operation B. Accordingly, the edges indicate the ordering of the functions within a given process thread. In this example, the operations correspond to arithmetic functions from the process thread 105. It should be appreciated, however, that functions or operations also can refer to larger, or more complex, portions of logic beyond the arithmetic functions illustrated herein.

Continuing with FIG. 1, the statement "x_tmp=x1+x2;" indicates an addition operation represented by node A of the order of operations graph 110. The statement "x1_tmp=x_tmp*x1;" indicates a multiplication operation represented by node B of the order of operations graph 110. The statement "x2_tmp=x1_tmp/x_tmp;" indicates a division operation represented by node C. The statement "x2_tmp=x1_tmp−x2_tmp;" indicates a subtraction operation represented by node D. The order of operations graph 110 flows from A to B to C to D in accordance with the order of operations in the process thread 105.

FIG. 2 is a diagram illustrating a plurality of order of operations graphs in accordance with another embodiment of the present invention. As noted, the order of operations graph 110, also denoted as "G1", has been extracted from process thread 105. The order of operations graphs 205 (G2) and 210 (G3) have been derived from other process threads (not shown) of the same cycle-accurate circuit description from which graph 110 was extracted. Each of the order of operations graphs G1, G2, and G3 can be represented as a set of edges. The graph G1 can be represented as "G1={AB, BC, BD, CD}". The graph G2 can be represented as "G2={AB, CB, BD}". The graph G3 can be represented as "G3={AB, AC, CD, BD}".

FIG. 3 is an order of operations graph 305 in accordance with another embodiment of the present invention. The order of operations graph 305 is created by merging the order of operations graphs 110, 205, and 210 of FIG. 2. In one embodiment, the graphs can be merged by taking an iterative intersection of individual graphs, e.g., graphs 110, 205, and 210. Solid edges of graph 305, such as AB and BD, represent unconditional edges or datapaths. An unconditional edge is an edge that is found within each of the underlying order of operations graphs. Conditional edges, or datapaths, are indicated by dotted edges, e.g., CD. Conditional edges are not found within each underlying order of operations graph. More particularly, a conditional edge is found in more than two order of operations graphs, but in less than all of the order of operations graphs. Accordingly, a dotted edge is indicative of the need for a multiplexer to control signal flow so that the node, or function, can be shared among two or more different process threads. Those edges that are found in only one underlying order of operations graph indicate control signals needed to multiplex the conditional edge(s), but are not multiplexed themselves. Thus, edges BC, CB, and AC are indicative of control signals relating to node C and are represented with dashed-dotted lines in FIG. 3.

In merging the order of operations graphs, an intersection of all of the order of operations graphs of the process threads can be taken. The intersection of all of the order of operations graphs 110, 205, and 210 can be denoted as "$G0^1$" and is illustrated below.

$$G0^1 = G1 \cap G2 \cap G3$$
$$= \{AB, BD\}$$

The intersection of all of the graphs indicates those edges that are unconditional, i.e., are located within each underlying graph 110, 205, and 210.

After taking the intersection of all of the order of operations graphs for the process threads, the order of operations graphs can be compared or processed in groups according to a number of iterations "M" specified by the circuit designer. If, for example, the total number of order of operations graphs is "N", then in a subsequent iteration, the order of operations graphs for the process threads can be compared in groups of "N–1". In a further iteration, the order of operations graphs for the process threads can be compared in groups of "N–2", etc. for the number of iterations "M" specified, where the total number of iterations does not exceed N–1. During each iteration, the edges found during prior iterations are removed from the analysis.

In illustration, the second iteration of the merging of the order of operations graphs can be performed as follows.

$$G0^1 = \{\{G1 - G0^1\} \cap \{G2 - G0^1\}\} \cup \{\{G1 - G0^1\} \cap \{G3 - G0^1\}\} \cup \{\{G2 - G0^1\} \cap \{G3 - G0^1\}\}$$
$$= \emptyset \cup \{CD\} \cup \emptyset$$
$$= \{CD\}$$

As shown, the edges found from prior iterations, in this case $G0^1$, are removed from the calculation. Since N=3, groupings of N–1, or 2, order of operations graphs are compared. The intersection of the following groupings are taken: (G1, G2), (G1, G3), and (G2, G3). The union of the intersections of the groups is then taken.

The edge CD is determined from a comparison of groupings having two order of operations graphs, the edge CD can be said to exist for two conditions. In particular, the edge CD exists in the order of operations graphs G1 and G3. In implementing the circuit design, the conditional edge CD would be indicative of the need for a multiplexer. The fact that the conditional edge CD is shared by two order of operations graphs indicates that the multiplexer will have two inputs. Edges AC, CB, and BC, are used in only one of the order of operations graphs. As such, edges AC, CB, and BC are indicative of control signals for the multiplexer inserted for edge CD. These edges are shown for completeness, but are not multiplexed.

FIG. 4 is a flow chart illustrating a method 400 of generating multithreaded datapaths for a circuit description in accordance with another embodiment of the present invention. In step 405, a cycle-accurate circuit description can be loaded into a software-based design tool. In step 410, process threads of the circuit description can be identified. The process threads of the circuit description can be designated by the circuit designer using identifiers or other markers within the circuit description. In one embodiment, only those process threads that are sequential in nature or that are unrelated are identified for processing.

In step 415, an order of operations graph for each of the process threads identified in step 410 can be generated. Beginning in step 420, the order of operations graphs can be merged. In merging the order of operations graphs, an iterative intersection process can be applied which can identify those portions of logic, i.e., nodes of the order of operations graphs, which are shared and those that are not shared among the identified process threads of the circuit design. Through the merge process, edges that are conditional and the edges that are unconditional in the resulting merged order of operations graph can be identified.

As noted, a conditional edge is a dependency that is found within fewer than all, and in more than one, of the order of operations graphs to be merged. An unconditional edge is a dependency that is found within each of the merged order of operations graphs. The number of conditional edges of the merged order of operations graph indicates the number of multiplexers that must be added to the circuit design to share the common nodes. Additional information can be determined from the individual order of operations graphs that are merged as will be described herein in further detail.

In step 420, a user-specified value of "M" can be received. The value of "M" indicates the number of times the iterative intersection process is to iterate. In one embodiment, the value of M can be restricted or limited such that the iterative intersection process does not perform a number of iterations that exceeds the total number of order of operations graphs that are being merged. Thus, if the total number of order of operations graphs being merged is denoted as "N", the value of M can be restricted to M<N. In step 425, a counter for counting the iterations of the iterative intersections can be initialized to 1.

In step 430, the iterative intersection process can begin and the first iteration of the process can be performed. Accordingly, in step 430, the intersection of all N order of operations graphs from the various process threads identified in the circuit description can be taken as described herein. In step 435, the set of edges determined as a result of step 430 can be stored. Edges determined in step 430 represent non-multiplexed datapaths as the edges are unconditional.

In step 440, a determination can be made as to whether the value of the counter is equal to the value of M. If so, the method can proceed to step 460 to continue processing. If not, the method can proceed to step 445 to perform a further iteration. In step 445, groups of "M-counter" order of operations graphs can be compared. Any previously identified edges, e.g., from prior iterations, can be removed from this comparison as illustrated with reference to FIGS. 1-3. In step 450, any edges determined from the comparison in step 445 can be stored. Edges determined in step 445 are conditional and represent multiplexed datapaths. In step 455, the counter can be incremented. The method can loop back to step 440 and continue processing until such time that the value of the counter is equal to the value of M.

For example, if N=10 and M=9, the process can iterate 9 times. During the first iteration, the intersection of all 10 order of operations graphs is taken. This process identifies unconditional edges. During the next iteration, the process is performed upon groups of 9 order of operations graphs. Each edge determined from comparing groups of 9 order of operations indicates the need for a multiplexer with 9 inputs. During the next iteration, groupings of 8 order of operations graphs would be compared to indicate the edges shared by 8 process threads. Each edge determined from the comparison of groups of 8 order of operations graphs indicates a need for a multiplexer having 8 inputs. The process can continue for groupings of 7, 6, 5, 4, 3, and 2 order of operations graphs.

Continuing with step 460, where the value of the counter has been determined to be equal to the value of M, multiplexers can be created for sharing resources. As noted, the number of multiplexers needed is equal to the number of conditional, or dotted lined, edges of the merged order of operations graph. The degree to which resources are shared depends upon the number of iterations performed. Increased resource sharing results from more iterations. In any case, the number of multiplexers can be equal to the number of stored conditional edges determined from the process.

The number of inputs to each multiplexer can be determined from a review of the original order of operations graphs. For a given conditional edge, the number of inputs that will be required for the multiplexer corresponding to that conditional edge is equal to the number of original order of operations graphs that include that edge. In one embodiment, this information can be determined during the iterative processing. For example, each conditional edge determined from an iteration in which groupings of "X" order of operations graphs are compared indicates the need for a multiplexer having "X" inputs. This information can be stored with a conditional edge when that edge is determined.

The bitwidth for each input to the multiplexers also can be determined from a review of the code of the circuit description from which the order of operations graphs are extracted. Such information can be determined from data types that are defined within the circuit description.

In step 465, control bits can be generated for each multiplexer that is created in step 460. The control bits can be determined from an analysis of the underlying order of operations graphs used to create the merged order of operations graph. The control bits determine the signal routing behavior of each multiplexer. Thus, the inserted multiplexers selectively couple operations between different process threads for sharing. In step 470, a state store register can be added for each shared node, e.g., for each node that is connected to a conditional edge. As each conditional edge will be multiplexed in order to share the operator, a storage register is needed to preserve the state of the operator so that the operator can be used to process information from another processing thread and successfully return to the state that existed prior to processing that data.

In step 475, an updated circuit description can be generated that specifies the added multiplexers and storage registers. The updated circuit description can be specified in an HDL that can be provided to a synthesis tool for creating the circuit design using a PLD.

The embodiments disclosed herein facilitate the creation of multithreaded datapaths from a cycle-accurate circuit description for a PLD. Process threads from the circuit description can be processed to create an order of operations graph for each such thread. The order of operations graphs can be merged through an iterative intersection technique to identify resources that can be shared and the multiplexers necessary to accomplish such sharing of resources among the different process threads.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustrations, and combinations of blocks in the flowchart illustrations, can be implemented by special purpose hardware-based systems that perform the specified functions or acts, or combinations of special purpose hardware and computer instructions.

The present invention can be realized in hardware or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, or the like.

The terms "computer program", "software", "application", computer-usable program code, variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e., open language. The term "coupled", as used herein, is defined as connected, although not necessarily directly, and not necessarily mechanically, e.g., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. Within a computer, a method of automatically generating multithreaded datapaths from a circuit description comprising:
   identifying a plurality of process threads from a circuit description, wherein each process thread comprises at least one function;
   representing each of the plurality of process threads as a separate order of operations graph comprising nodes that correspond to functions and edges that indicate dependencies between the functions;
   identifying at least one conditional edge from the order of operations graphs by identifying each edge that is not found within each other order of operations graph;
   generating an updated circuit description specifying a multiplexer for each conditional edge; and
   storing the undated circuit description in memory
   wherein identifying a plurality of process threads, representing each of the plurality of process threads, identifying at least one conditional edge generating an updated circuit description, and storing the updated circuit description are performed by the computer.

2. The method of claim 1, further comprising creating a storage register that stores output from at least one function of a process thread.

3. The method of claim 1, wherein identifying at least one conditional edge further comprises merging the order of operations graphs for the process threads.

4. The method of claim 1, wherein identifying at least one conditional edge further comprises taking an iterative intersection of the order of operations graphs, wherein the number of iterations is less than the number of order of operation graphs.

5. The method of claim 4, further comprising:
   during a first iteration of the iterative intersection, taking an intersection of all order of operations graphs corresponding to the process threads; and
   determining that each edge identified during the first iteration is an unconditional edge.

6. The method of claim 5, further comprising:
   during at least one subsequent iteration of the iterative intersection, comparing groupings of order of operations graphs, wherein the number of order of operations graphs in each grouping is the same and less than the total number of order of operations graphs; and
   storing each edge that is identified during the at least one subsequent iteration as a conditional edge.

7. The method of claim 1, further comprising determining control bits for each multiplexer associated with a conditional edge according to the order of operations graphs for the plurality of process threads.

8. The method of claim 1, further comprising, for a selected one of the multiplexers associated with a conditional edge, determining the number of inputs to that multiplexer according to the number of process threads comprising the edge associated with that multiplexer.

9. The method of claim 8, further comprising determining the bitwidth of signals into each multiplexer associated with a conditional edge according to the circuit description.

10. Within a computer, a method of automatically generating multithreaded datapaths from a circuit description comprising:
    representing each of a plurality of process threads from the circuit description as a separate order of operations graph comprising nodes that correspond to functions of the process threads and edges that indicate dependencies among the functions;
    taking an iterative intersection of the order of operations graphs to identify at least one edge not shared by all order of operations graphs;
    associating a multiplexer with each identified edge;
    generating an updated circuit description specifying a multiplexer corresponding to each identified edge, wherein each multiplexer selectively links functions common to more than one of the plurality of process threads; and
    storing the updated circuit description in memory,
    wherein representing taking an iterative intersection, generating, and storing the undated circuit description are performed by the computer.

11. The method of claim 10, wherein taking an iterative intersection further comprises:
    during a first iteration, taking an intersection of all order of operations graphs corresponding to the process threads; and
    determining that each edge identified during the first iteration represents a non-multiplexed datapath.

12. The method of claim 11, further comprising:
    during at least one subsequent iteration, comparing groupings of order of operations graphs, wherein the number of order of operations graphs in each grouping is the same for a given iteration and is less than the total number of order of operations graphs; and
    selecting each edge that is identified during the at least one subsequent iteration as an edge that represents a multiplexed datapath.

13. A computer program product comprising:
    a computer-usable medium having computer-usable program code that, when executed by a computer, causes the computer to create multithreaded datapaths for a circuit description, said computer program product including:
    computer-usable program code that identifies a plurality of process threads from a circuit description, wherein each process thread comprises at least one function;
    computer-usable program code that represents each of the plurality of process threads as a separate order of operations graph comprising nodes that correspond to functions and edges that indicate dependencies between the functions;
    computer-usable program code that identifies at least one conditional edge from the order of operations graphs by identifying each edge that is not found within each other order of operations graph; and
    computer-usable program code that generates an updated circuit description specifying a multiplexer for each conditional edge.

14. The computer program product of claim 13, further comprising computer-usable program code that creates a storage register that stores output from at least one function of a process thread.

15. The computer program product of claim 13, wherein the computer-usable program code that identifies at least one conditional edge further comprises computer-usable program code that takes an iterative intersection of the order of operations graphs, wherein the number of iterations is less than the number of order of operation graphs.

16. The computer program product of claim 15, further comprising:
   computer-usable program code that, during a first iteration of the iterative intersection, takes an intersection of all order of operations graphs corresponding to the process threads; and
   computer-usable program code that determines that each edge identified during the first iteration is an unconditional edge.

17. The computer program product of claim 16, further comprising:
   computer-usable program code that, during at least one subsequent iteration of the iterative intersection, compares groupings of order of operations graphs, wherein the number of order of operations graphs in each grouping is the same and less than the total number of order of operations graphs; and
   computer-usable program code that stores each edge that is identified during the at least one subsequent iteration as a conditional edge.

18. The computer program product of claim 13, further comprising computer-usable program code that determines control bits for each multiplexer associated with a conditional edge according to the order of operations graphs for the plurality of process threads.

19. The computer program product of claim 13, further comprising computer-usable program code that, for a selected one of the multiplexers associated with a conditional edge, determines the number of inputs of that multiplexer according to the number of processing threads comprising the edge associated with that multiplexer.

20. The computer program product of claim 19, further comprising computer-usable program code that determines the bitwidth of signals into each multiplexer associated with a conditional edge according to the circuit description.

* * * * *